(12) United States Patent
Noguchi et al.

(10) Patent No.: US 11,848,219 B2
(45) Date of Patent: Dec. 19, 2023

(54) MOUNTING APPARATUS AND FILM SUPPLY APPARATUS

(71) Applicant: SHINKAWA LTD., Tokyo (JP)

(72) Inventors: Yuichiro Noguchi, Tokyo (JP); Katsutoshi Nomura, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 225 days.

(21) Appl. No.: 17/050,453

(22) PCT Filed: Jan. 21, 2019

(86) PCT No.: PCT/JP2019/001627
§ 371 (c)(1),
(2) Date: Oct. 25, 2020

(87) PCT Pub. No.: WO2019/207858
PCT Pub. Date: Oct. 31, 2019

(65) Prior Publication Data
US 2021/0242051 A1  Aug. 5, 2021

(30) Foreign Application Priority Data

Apr. 26, 2018  (JP) .................................. 2018-084887

(51) Int. Cl.
*H01L 21/67* (2006.01)
*H01L 23/00* (2006.01)

(52) U.S. Cl.
CPC ........ *H01L 21/67144* (2013.01); *H01L 24/75* (2013.01); *H01L 2224/7592* (2013.01); *H01L 2224/75987* (2013.01)

(58) Field of Classification Search
CPC ............... H01L 21/67144; H01L 24/75; H01L 2224/7592; H01L 2224/75987
See application file for complete search history.

(56) References Cited

U.S. PATENT DOCUMENTS 4,913,763 A * 4/1990 Yamazaki ........... B29C 66/9241
156/497
6,347,655 B1  2/2002 Yamamoto et al.
(Continued)

FOREIGN PATENT DOCUMENTS

JP    S58135051    8/1983
JP    2006261343    9/2006
(Continued)

OTHER PUBLICATIONS

"International Search Report (Form PCT/ISA/210)" of PCT/JP2019/001627, dated Mar. 12, 2019, with English translation thereof, pp. 1-4.

*Primary Examiner* — Minh N Trinh
(74) *Attorney, Agent, or Firm* — JCIPRNET

(57) ABSTRACT

A mounting apparatus (10) serves to place a film between an electronic component and a bottom surface of a mounting head and mount the electronic component. The mounting apparatus includes: a film winding mechanism (18) that rotates a winding reel (26) to wind in a film spanning from a dispensing reel to the winding reel (26), the film winding mechanism (18) executing the winding so that a new film is disposed on the bottom surface of the mounting head each time when an electronic component is mounted; a tension detecting part (38) that detects the tension of the film after the same is wound by the film winding mechanism (18); and a control part (20) that rotates the winding reel (26) by a winding motor (30) to adjust the tension on the basis of the tension detected by the tension detecting part (38). A film supply apparatus is also provided.

6 Claims, 6 Drawing Sheets

(56) References Cited

U.S. PATENT DOCUMENTS

| | | | |
|---|---|---|---|
| 6,428,644 B1 | 8/2002 | Ohno et al. | |
| 8,132,608 B2* | 3/2012 | Chen | B65H 37/04 |
| | | | 156/550 |
| 2021/0242051 A1* | 8/2021 | Noguchi | B65H 23/1955 |

FOREIGN PATENT DOCUMENTS

| | | |
|---|---|---|
| JP | 2015035493 | 2/2015 |
| JP | 2017123423 | 7/2017 |
| TW | 428184 | 4/2001 |
| TW | 457601 | 10/2001 |

* cited by examiner

MOUNTING APPARATUS AND FILM SUPPLY APPARATUS

CROSS-REFERENCE TO RELATED APPLICATION

This application is a 371 application of international application of PCT application serial no. PCT/JP2019/001627, filed on Jan. 21, 2019, which claims the priority benefit of Japan application no. 2018-084887, filed on Apr. 26, 2018. The entirety of each of the above-mentioned patent applications is hereby incorporated by reference herein and made a part of this specification.

BACKGROUND OF THE INVENTION

1. Field of the Invention

The present invention relates to a mounting apparatus that places a film between an electronic component and a bottom surface of a mounting head and mounts the electronic component, and a film supply apparatus.

2. Description of Related Art

Conventionally, the flip chip bonder technology for mounting a semiconductor chip (electronic component) to a substrate without using a wire is widely known. In such a flip chip bonder, the substrate is coated with an adhesive material made of a thermosetting resin in advance, and the semiconductor chip is fixed to the substrate via the adhesive material. In such case, at the time of heating and pressing the semiconductor chip by a mounting head, the adhesive material extruded by the semiconductor chip may crawl upward and be adhered to the mounting head. In addition, even if the adhesive material is not adhered to the mounting head, the fume gas generated from the heated adhesive material may intrude into the mounting head.

In order to prevent such adhesive material from being adhered to a thermal compression bonding tool (mounting head), Patent Document 1 discloses a mounting apparatus in which the bottom surface of the thermal compression bonding tool is covered by a film member (film). That is, in the mounting apparatus of Patent Document 1, a film member transport mechanism (film supply apparatus) that sequentially supplies a film placed between the bottom surface of the mounting head and a chip component (electronic component) is provided. Each time when the chip component is mounted, a new film member is supplied to the bottom surface of the thermal compression bonding tool. According to such a mounting apparatus, the adhesive material can be effectively prevented from being adhered to the thermal compression bonding tool.

PRIOR ART DOCUMENT

Patent Document

Patent Document 1: Japanese Laid-Open No. 2015-35493

SUMMARY OF THE INVENTION

Problems to be Solved by the Invention

Conventionally, an electronic component is suction-held on the bottom surface of a mounting head. Since the suction surface is covered by a film, in order to suction the electronic component, a needle is used to form a hole for suction on the film.

Conventionally, in the case where the tension of the film is small, the film on the bottom surface of the mounting head is slack, making it difficult for the needle to pierce through. In addition, if the film on the bottom surface of the mounting head is slack, at the time when the electronic component is suctioned to the mounting head via the film, the adhesion between the mounting head and the electronic component deteriorates. Meanwhile, in the case where the tension of the film is large, the film on the bottom surface of the mounting head is wrinkled. In such case, at the time when the electronic component is suctioned to the mounting head, the adhesion between the mounting head and the electronic component also deteriorates.

The objective of the present invention is to provide a mounting apparatus that places a film between a bottom surface of a mounting head and an electronic component and mounts the electronic apparatus, and that, in a film supply apparatus, a desired tension is generated in the film.

Means for Solving the Problem

A mounting apparatus of the present invention is configured to place a film between an electronic component and a bottom surface of a mounting head and mount the electronic component and includes: a film winding mechanism, rotating a winding reel to wind in a film spanning from a dispensing reel to the winding reel, and executing the winding so that a new film is disposed on a bottom surface of the mounting head each time when an electronic component is mounted; a tension detecting part, detecting a tension of the film after the film is wound by the film winding mechanism; and a control part, rotating the winding reel by a winding motor to adjust the tension based on the tension detected by the tension detecting part. The film winding mechanism includes an elastic member disposed between a rotation shaft of the winding motor and the winding reel, so that the winding reel follows rotation of the rotation shaft of the winding motor. The tension detecting part detects the tension of the film based on an amount of deformation of the elastic member.

In the mounting apparatus of the present invention, it is also suitable that the film winding mechanism further includes: a motor arm, directly or indirectly connected with the rotation shaft of the winding motor and extending in a predetermined direction; and a reel arm, directly or indirectly connected with a rotation shaft of the winding reel, extending in a direction corresponding to the motor arm, and rotating with the motor arm about a same center. One end of the elastic member is connected with the motor arm, another end of the elastic member is connected with the reel arm, and the elastic member causes the reel arm to follow the motor arm. In addition, the tension detecting part detects the tension based on an interval between the motor arm and the reel arm in a rotating direction, and the interval is generated by the deformation of the elastic member.

In the mounting apparatus of the present invention, it is also suitable that the tension detecting part detects the tension as excessively small in a case where the interval is less than a first predetermined value, and detects the tension as excessively large in a case where the interval is greater than a second predetermined value greater than the first predetermined value.

In the mounting apparatus of the present invention, it is also suitable that a pair of detecting arms are directly or indirectly connected with a first arm that is one of the motor arm and the reel arm, extend toward a second arm that is the other, and are configured to cross at least one of the second arm and a detected object connected with the second arm, the pair of detecting arms include a first sensor and a second sensor capable of detecting at least one of the second arm and the detected object between the pair of detecting arms, the first sensor is disposed on a side of the first arm in the pair of detecting arms and the second sensor is disposed in a predetermined interval in a direction distant from the first arm with respect to the first sensor in the pair of detecting arms, the tension detecting part detects the tension as excessively small in a case where the first sensor detects at least one of the second arm and the detected object, and detects the tension as excessively large in a case where the first sensor does not detect the second arm and the detected object and the second sensor does not detect the second arm and the detected object.

In the mounting apparatus of the present invention, it is also suitable that the control part rotates the winding reel via the winding motor in a winding direction at a time when the tension is detected as excessively small, and rotates the winding reel via the winding motor in a reverse direction with respect to the winding direction at a time when the tension is detected as excessively large.

In the mounting apparatus of the present invention, it is also suitable that the control part rotates the winding reel via the winding motor at a time when the tension is detected as excessively small or excessively large until the first sensor does not detect the second arm and the detected object and the second sensor detects at least one of the or second arm the detected object.

A film supply apparatus of the invention includes: a film winding mechanism, rotating a winding reel to wind in a film spanning from a dispensing reel to the winding reel; a tension detecting part, detecting a tension of the film after a predetermined amount of the film is wound by the film winding mechanism; and a control part, rotating the winding reel by a winding motor to adjust the tension based on the tension detected by the tension detecting part. The film winding mechanism includes: a motor arm, directly or indirectly connected with a rotation shaft of the winding motor and extending in a predetermined direction; a reel arm, directly or indirectly connected with a rotation shaft of the winding reel, extending in a direction corresponding to the motor arm, and rotating with the motor arm about a same center; and an elastic member, wherein one end of the elastic member is connected with the motor arm, another end of the elastic member is connected with the reel arm, and the elastic member causes the reel arm to follow the motor arm. The tension detecting part detects the tension as excessively small in a case where an interval between the motor arm and the reel arm in a rotating direction is less than a first predetermined value, and detects the tension as excessively large in a case where the interval is greater than a second predetermined value greater than the first predetermined value. The control part rotates the winding reel via the winding motor in a winding direction at a time when the tension is detected as excessively small, and rotates the winding reel via the winding motor in a reverse direction with respect to the winding direction at a time when the tension is detected as excessively large.

Inventive Effect

According to the present invention, a desired tension can be generated in the film.

DESCRIPTION OF THE EMBODIMENTS

<Outline of Mounting>

In the following, the embodiments of the present invention will be described with reference to the drawings.

Figure 1:
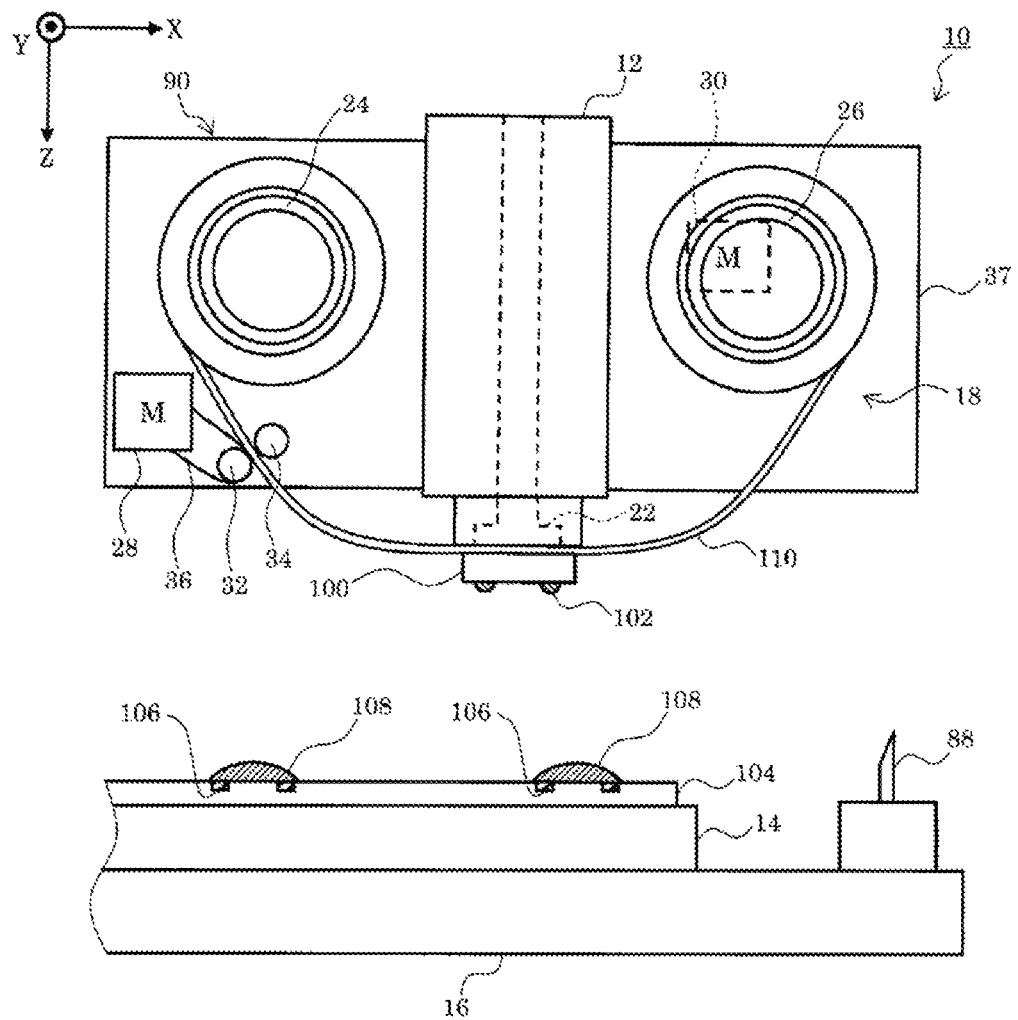
FIG. 1 is a view illustrating a configuration of a mounting apparatus.

FIG. 1 is a view illustrating a configuration of a mounting apparatus 1 of the embodiment. In FIG. 1, as well as the drawings described subsequently, an arrow X indicates a left-right direction of the apparatus, an arrow Y indicates a front-rear direction of the apparatus, and an arrow Z indicates an upper-lower direction of the apparatus.

The mounting apparatus 10 is an apparatus for manufacturing a semiconductor apparatus by mounting a plurality of semiconductor chips 100 (electronic components) to a substrate 104. The semiconductor chip 100 is mounted to the substrate 104 through the flip chip bonder technology. Specifically, on the bottom surface of each semiconductor chip 100, a protrusion, which is referred to as a bump 102 and made of a conductive material, is formed. By bonding the bump 102 to an electrode 106 formed on the surface of the substrate 104, the semiconductor chip 100 is electrically connected with the substrate 104.

Figure 2:
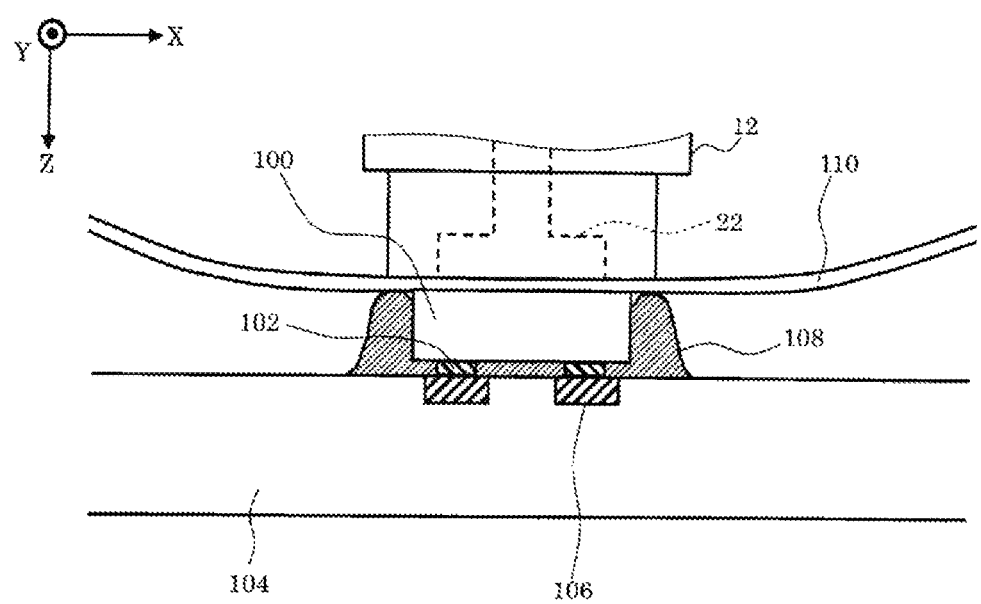
FIG. 2 is a side view illustrating mounting.

On the substrate 104, the mounting position of the semiconductor chip 100 is coated in advance with an adhesive material 108 referred to as a non-conductive paste (NCP) or a non-conductive film (NCF). The adhesive material 108 is made of a thermosetting resin having an insulating property as well as a thermosetting property. As shown in FIG. 2, the semiconductor chip 100 is placed on the adhesive material 108, pressed against the substrate 104, and heated. Accordingly, the adhesive material 108 is cured, and the semiconductor chip 100 is mechanically fixed to the substrate 104. The bump 102 is melted by heating the semiconductor chip 100, and the heating to the semiconductor chip 100 is stopped. The melted bump 102 is solidified and electrically bonded to the electrode 106 of the substrate 104 (circuit substrate).

<Configuration of Mounting Apparatus>

As shown in FIG. 1, the mounting apparatus 10 includes a bonding stage 14, a base 16, a mounting head 12, and a film supply apparatus 90.

The bonding stage 14 is a stage on which the substrate 104 is placed. The bonding stage 14 is, for example, provided with a suction hole (not shown) for suction-holding the substrate 104 and a heater (not shown) for heating the substrate 104. The bonding stage 14 is supported by the base 16. The base 16 is provided with a needle 88 for forming a hole for suction on a film 110 (to be described afterwards) covering the bottom surface of the mounting head 12. The base 16 is movable in the XY direction (horizontal direction).

The mounting head 12 is disposed opposite to the bonding stage 14 and is movable in the Z direction (vertical direction). A suction hole 22 for suction-holding the semiconductor chip 100 is formed on the bottom surface of the mounting head 12. The suction hole 22 is in communication with a suction pump not shown in the drawings. With a negative pressure generated by the suction pump, the semiconductor chip 10 is suction-held on the bottom surface of the mounting head 12 via the film 110. In addition, in order to heat the semiconductor chip 100 at the time of mounting, a heater (not shown) is hidden in the mounting head 12.

The film supply apparatus 90 supplies the long, strip-like film 110 to the bottom surface of the mounting head 12. Since the film 110 is heated on the bottom surface of the mounting head 12 and contacts the adhesive material 108, a material having excellent heat resistance and highly peelable with respect to the adhesive material 108 is suitable to serve as the material of the film 110. Therefore, as the material of the film 110, for example, a fluororesin such as polytetrafluoroethylene (PTFE), tetrafluoroethylene/perfluoroalkyl vinyl ether copolymer (PFA), etc., can be used.

The film supply apparatus 90 includes a frame 37, a dispensing reel 24 and a winding reel 26 provided to sandwich the mounting head 12, a dispensing motor 28 rotating rollers 32, 34 to deliver the film 110 from the dispensing reel 24 toward the winding reel 26, and a winding motor 30 rotating the winding reel 26. The film supply apparatus 90 is integrated with the mounting head 12 and moves with the mounting head 12.

The dispensing reel 24 and the winding reel 26 are rotatably maintained on the frame 37. The film 110 before use (before being disposed on the bottom surface of the mounting head 12) is wound about the outer periphery of the dispensing reel 24. Similarly, the film 110 after use (after being disposed on the bottom surface of the mounting head 12) is wound about the outer periphery of the winding reel 26. While the film 110 may be directly wound on each of the dispensing reel 24 and the winding reel 26, in the embodiment, the film 110 is wound on each of the dispensing reel 24 and the winding reel 26 via a circular core material. The two core materials on which the film 110 is wound are configured as being respectively pressed into the respective outer peripheries of the dispensing reel 24 and the winding reel 26.

The dispensing motor 28 is a stepping motor, and the rotational force of the dispensing motor 28 is transmitted to the roller 32 via a belt 36. The roller 34 is disposed opposite to the roller 32, and the film 110 is sandwiched between the rollers 32 and 34. With the motor 28 driving the roller 32 to rotate, the roller 34 also rotates, and the film 110 is delivered from therebetween. The winding motor 30 is a stepping motor and is disposed on the back side of the winding reel 26 (the rear side of the mounting apparatus 10). While the embodiment is not provided with a motor for rotating and driving the dispensing reel 24, such a motor may also be provided.

<Mounting Operation>

Figure 3:
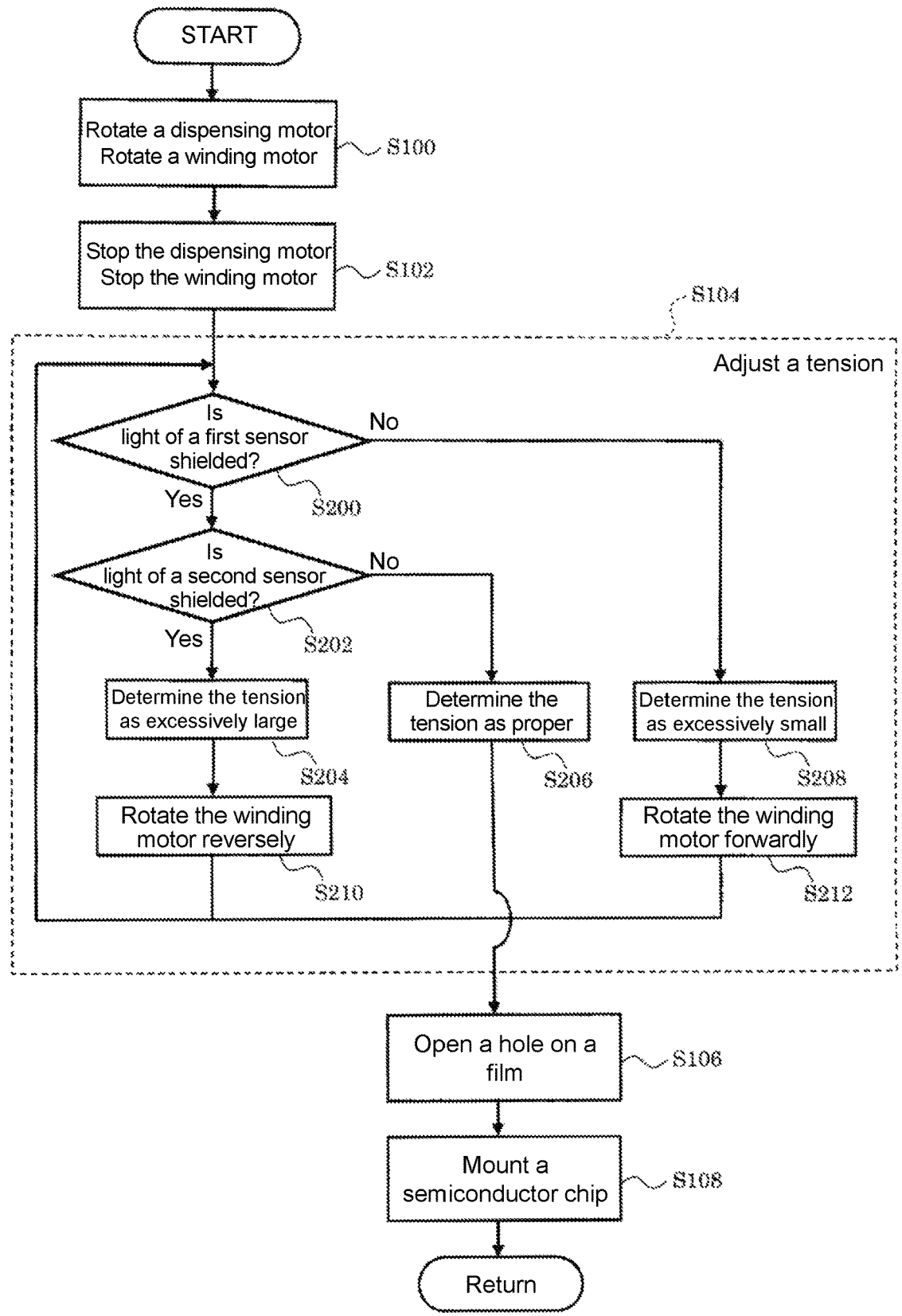
FIG. 3 is a flowchart illustrating processes of the mounting apparatus.

Here, the mounting operation of the mounting apparatus 10 will be described. FIG. 3 is a flowchart illustrating the processes performed by the mounting apparatus 10. Firstly, in Step S100, the dispensing motor 28 and the winding motor 30 of the film supply apparatus 90 are rotated to dispense a predetermined amount of the film 110. In Step S102, the dispensing motor 28 and the winding motor 30 are stopped. In the case where the motor that rotates and drivers the dispensing reel 24 is provided, the motor is also rotated together and then stopped. Accordingly, a new film 110 is disposed on the bottom surface of the mounting head 12. Then, in Step S104, the tension of the film 110 is adjusted. In the embodiment, the tension adjustment feature is provided, and details in this regard will be described in the following.

After the tension adjustment in Step S104, in Step S106, the needle 88 is used to form the hole for suction on the film 110 positioned on the bottom surface of the mounting head 12. This is carried out by horizontally moving the base 16 of the bonding stage 14 shown in FIG. 1, setting the needle 88 right below the mounting head 12, and then lowering (vertically moving) the mounting head 12 toward the needle 88. Then, the mounting head 12 is elevated.

Then, in Step S108, the semiconductor chip 100 is mounted on the substrate 104. Specifically, the following is performed. A pedestal (not shown) on which the semiconductor chip 100 is placed is moved horizontally, and the mounting head 12 is lowered to pick up the semiconductor chip 100 from the pedestal. Then, after the mounting head 12 is elevated, the base 16 of the bonding stage 14 is moved horizontally, and the mounting position of the semiconductor chip 100 on the substrate 104 is set to be right below the mounting head 12. The mounting position is coated with the adhesive material 108, as shown in FIG. 1. Then, the mounting head 12 is lowered toward the substrate 104, and the semiconductor chip 100 is placed at the mounting position (the adhesive material 108) on the substrate 104 and then heated and pressed to be mounted.

At this time, with the mounting head 12 pressing the semiconductor chip 100, as shown in FIG. 2, a portion of the material 108 extruded to the outside by the semiconductor chip 100 protrudes and crawls up. If the adhesive material 108 that crawls up is adhered to the mounting head 12, it is possible that the subsequent mounting processes cannot be properly carried out. In addition, even if the adhesive material 108 is not adhered to the mounting head 12, there is also a case in which a fume gas generated from the heated adhesive material 108 enters the suction hole 22 of the mounting head 12 and thus contaminates the mounting head 12.

In the embodiment, since the film 110 is placed between the mounting head 12 and the semiconductor chip 100, as shown in FIG. 2, the adhesion of the adhesive material 108 to the mounting head 12 and the intrusion of the fume gas into the suction hole 22 of the mounting head 12 are avoided.

After the semiconductor chip 100 is mounted, the mounting head 12 is elevated, and a series of processes end. The mounting processes described above are performed for each semiconductor chip 100. Each time when the semiconductor chip 100 is mounted, the film 110 is wound on the winding reel 26, and a new film 110 is disposed on the bottom surface of the mounting head 12.

<Outline of Tension Adjustment>

In the following, the tension adjustment to the film 110 will be described. In the case where the tension of the film 110 is small, the film 110 on the bottom surface of the mounting head is slack. In this case, it is difficult for the needle 88 for forming the hole for suction to pierce through, and a hole in a desired shape therefore cannot be formed. In addition, if the film 110 on the bottom surface of the mounting head is slack, at the time when the semiconductor chip 100 is suctioned to the bottom surface of the mounting head 12, the adhesion between the mounting head 12 and the semiconductor chip 100 deteriorates. Meanwhile, in the case where the tension of the film 100 is large, the film 110 on the bottom surface of the mounting head 12 is wrinkled. In such case, the adhesion between the mounting head 12 and the semiconductor chip 100 also deteriorates.

Here, the mounting apparatus 10 according to the embodiment adjusts the tension of the film 100 and effectively suppresses the deterioration. The film supply apparatus 90 of the mounting apparatus 10 detects the tension of the film 110, and rotates the winding reel 26 to adjust the tension of the film 110 by the winding motor 30 based on the detected tension.

<Schematic Configuration of Film Supply Apparatus>

Figure 4:
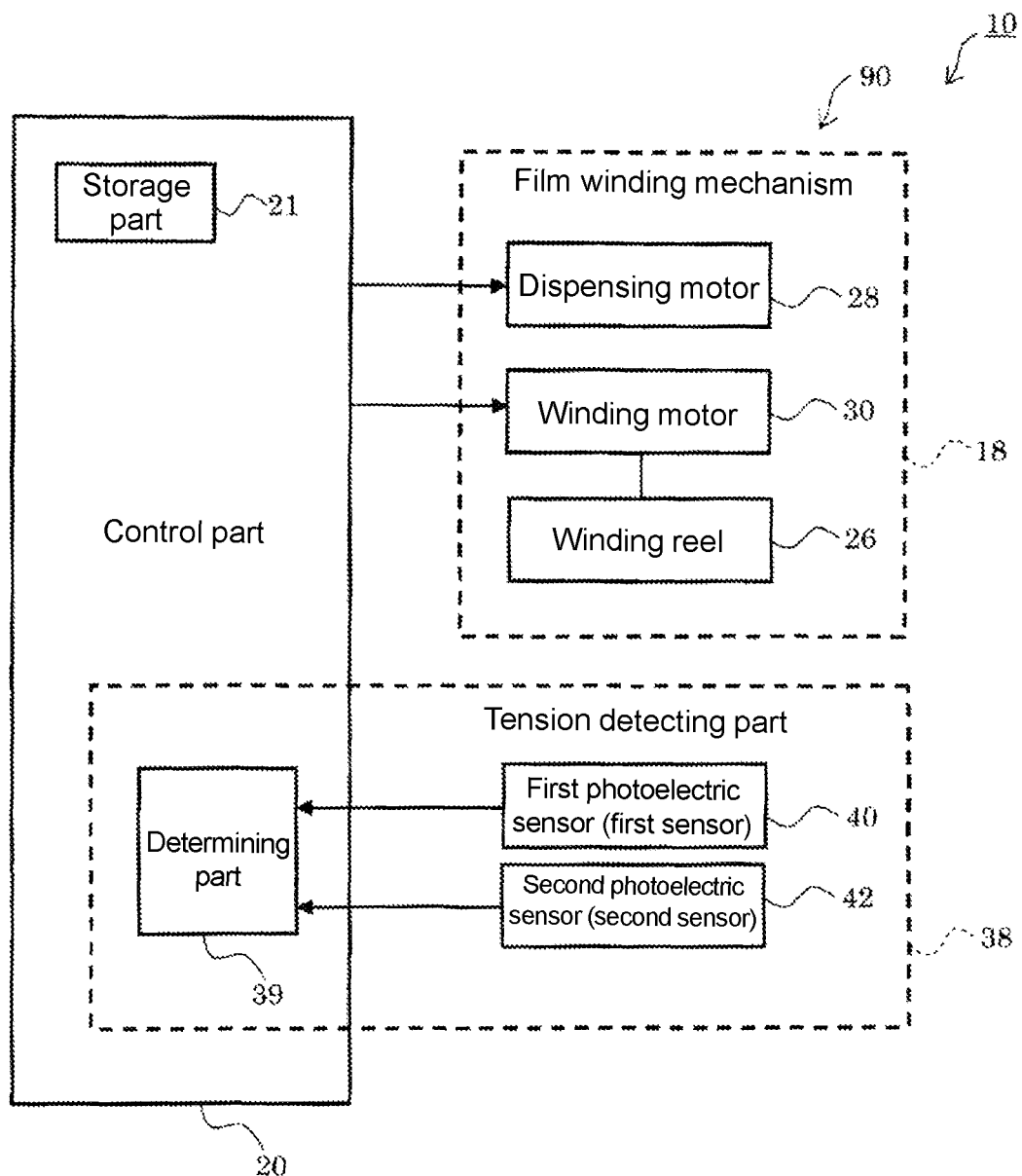
FIG. 4 is a block diagram illustrating a schematic configuration of a film supply apparatus.

FIG. 4 is a block diagram illustrating a schematic configuration of the film supply apparatus 90. The film supply apparatus 90 includes a film winding mechanism 18 that performs winding so that a new film 110 is disposed on the bottom surface of the mounting head 12 in each mounting, a tension detecting part 38 that detects the tension of the film 110 after the film 110 is wound by the film winding mechanism 18, and a control part 20 that rotates the winding reel 26 by the winding motor 30 to adjust the tension on the basis of the tension detected by the tension detecting part 38.

The film winding mechanism 18 includes the dispensing motor 28, the winding motor 30, and the winding reel 26. The film winding mechanism 18 has a structure for detecting and adjusting the tension of the film 110. Details in this regard will be described afterwards.

The tension detection part 38 includes a first photoelectric sensor 40 (first sensor), a second photoelectric sensor 42 (second sensor), and a determining part 39 that is a portion of the control part 20. The respective detecting signals of the first photoelectric sensor 40 and the second photoelectric sensor 42 are input to the determining part 39. The determining part 39 determines the tension of the film 110 as excessively large, excessively small, or proper from the input detecting signals. The specific configurations and functions of the first photoelectric sensor 40 and the second photoelectric sensor 42 and the determining method of the determining part 39 based on the detecting signals of the sensors will be described in the following.

The control part 20 includes a processor and, by executing a process according to a program stored in a storage part 21, controls the film winding mechanism 18 to wind the film 110 after mounting of the semiconductor chip 100, adjusts the tension of the film 100 after the film 100 is wound, and functions as the determining part 39 of the tension detecting part 38. The control part 20 of the film supply apparatus 90 may be the same as or different from the control part of the mounting apparatus 10 (the control part that controls the mounting head 12, the bonding stage 14, etc.). In the case where the control part 20 of the film supply apparatus 90 is the same as the control part of the mounting apparatus 10, the control part 20 of the film supply apparatus 90 follows the command of the control part of the mounting apparatus 10.

<Film Winding Mechanism>

Figure 5:
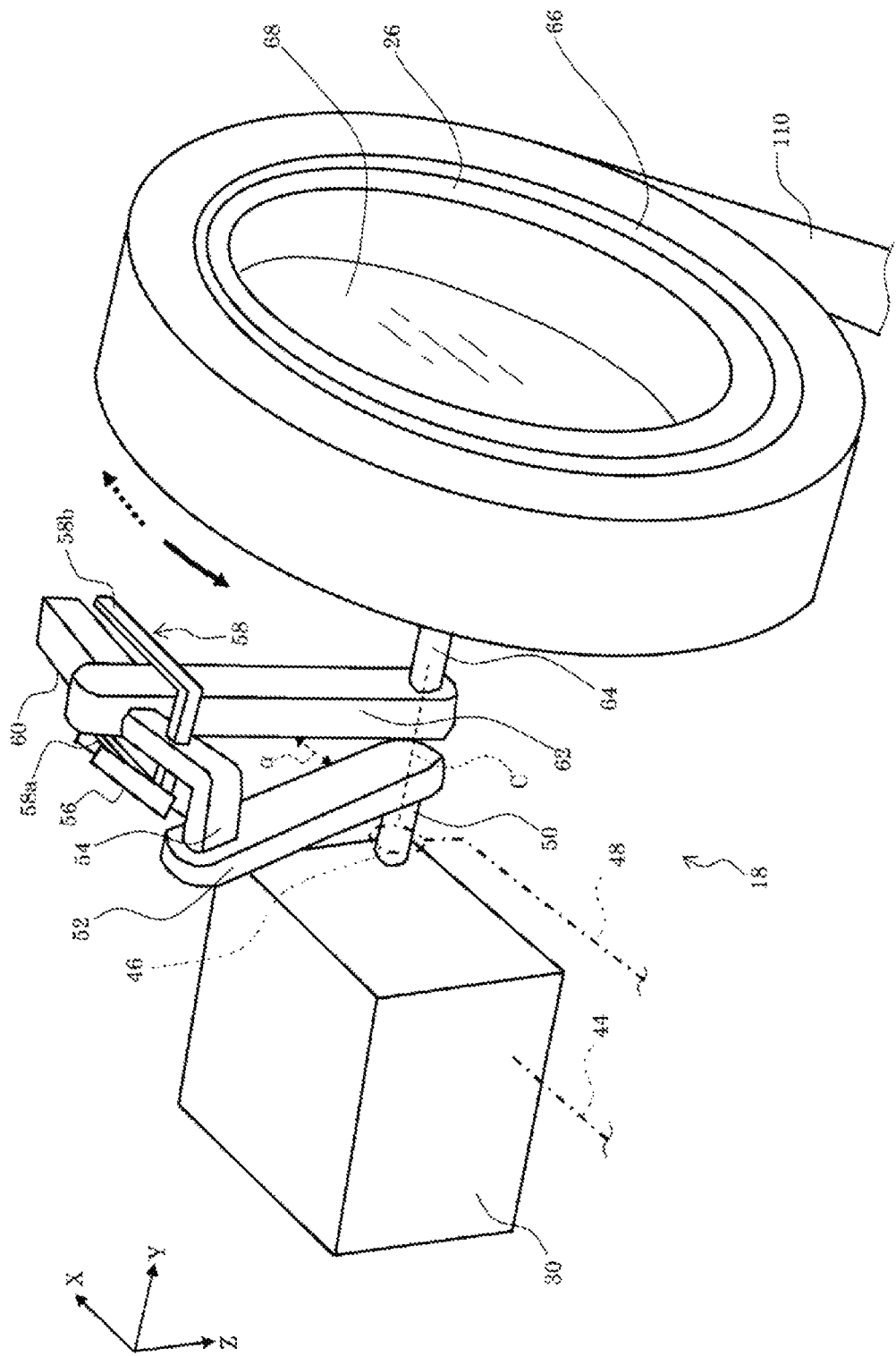
FIG. 5 is a perspective view illustrating a film winding mechanism.

In the following, the structure of the film winding mechanism 18 will be described. FIG. 5 is a perspective view illustrating the film winding mechanism 18. As shown in FIG. 5, the film winding mechanism 18 includes a motor arm 52 connected with a rotation shaft 50 of the winding motor 30 and extending in a radical direction (a predetermined direction) of the winding reel 26, a reel arm 62 connected with a rotation shaft 64 of the winding reel 26 and extending in a radical direction (a direction corresponding to the motor arm 52) of the winding reel 26, and an extension spring 56 (elastic member).

The winding motor 30 is disposed on the rear side of the winding reel 26, fixed to the frame, and connected with a wire 44 such as a power supply wire. The rotation shaft 50 of the winding motor 30 extends to the front, and the tip of the rotation shaft 50 is connected with the motor arm 52.

The film 100 after use is wound on the winding reel 26 via a core material 66. The thick, black arrow in FIG. 5 indicates the winding direction of the film 110. A circular cover 68 that blocks a rear side opening is fixed to the winding reel 26. The rotation shaft 64 of the winding reel 26 protrudes from the rear side surface of the circular cover 68 toward the rear side, and is rotatably supported by a bearing (not shown) fixed to the frame. The tip of the rotation shaft 64 of the winding reel 26 is connected to the reel arm 62.

The rotation shaft 50 of the winding motor 30 and the rotation shaft 64 of the winding reel 26 are disposed on the same line. That is, the motor arm 52 and the reel arm 62 are disposed to rotate about the same center C. One end of the extension spring 56 is connected to a vicinity of the tip of the motor arm 52 and the other end of the extension spring 56 is connected to a vicinity of the tip of the reel arm 62.

As shown in FIG. 5, the film winding mechanism 18 further includes an auxiliary arm 54 connected with a vicinity of the tip of the motor arm 52, a pair of detecting arms 58 connected with the auxiliary arm 54, and a detected object 60 connected with the reel arm 62. Details concerning these components will be described in the following. The structure of FIG. 5 is a structure in which the auxiliary arm 54 is not bonded to the reel arm 62, and the motor arm 52 and the reel arm 62 are bonded by only the extension spring 56.

In addition, while the rotation shaft 50 of the winding motor 30 is directly connected with the motor arm 52 in the embodiment, these components may also be indirectly connected via a gear, an auxiliary arm, etc. Similarly, while the rotation shaft 64 of the winding reel 26 is directly connected with the reel arm 62 in the embodiment, these components may also be indirectly connected via a gear, an auxiliary arm, etc. In addition, it suffices as long as the motor arm 52 extends in the predetermined direction, the reel arm 62 extends in a direction corresponding to the motor arm 52, the motor arm 52 and the reel arm 62 are configured rotate about the same center C, and the motor arm 52 and the reel arm 62 are connected by the elastic member such as the extension spring 56.

In FIG. 5, when the rotation shaft 50 of the winding motor 30 rotates in the counterclockwise direction, the motor arm 52 rotates to pull the reel arm 62 via the extension spring 56, the rotation shaft 64 of the winding reel 26 rotates in the counterclockwise direction (the direction of the thick, black arrow), and the film 110 is wound on the winding reel 26. Accordingly, the reel arm 62 is configured to follow the motor arm 52.

<Tension Detecting Part>

Then, the tension detecting part 38 will be described. After the film 110 is wound, the rollers 32, 34 on the dispensing side shown in FIG. 1 are locked to fix the film 110 between the rollers 32, 34. A predetermined tension acts on the film 110 from the rollers to the winding reel 26.

In the case where the tension of the film 110 is large, the extension spring 56 shown in FIG. 5 extends greatly, and an interval a between the motor arm 52 and the reel arm 62 in the rotating direction increases. Meanwhile, in the case where the tension of the film 110 is small, the extension spring 56 extends slightly or does not extend, and the interval a between the motor arm 52 and the reel arm 62 in the rotating direction decreases. By detecting the interval a, the tension of the film 110 can be detected. The interval a is not limited to the distance between the motor arm 52 and the reel arm 62, and may also be an angle formed by the motor arm 52 and the reel arm 62, or, in the case where one or both of the motor arm 52 and the reel arm 62 are connected with an auxiliary arm, a distance or angle from the auxiliary arm to the motor arm 52, the reel arm 62, or the other auxiliary arm, etc. By disposing a suitable sensor capable of detecting the interval a, as the tension detecting part 38, for example, the tension can be detected as excessively small in the case where the interval a is less than a first predetermined value (predetermined value), and detected as excessively large in the case where the interval a exceeds a second predetermined value (predetermined value) greater than the first predetermined value.

Here, specifically, the tension detecting part 38 of the embodiment will be described. As shown in FIG. 5, the detected object 60 that is rod-like is fixed to the side surface of the opposite side with respect to the motor arm 52 in the vicinity of the tip of the reel arm 62. Besides, the auxiliary arm 54 is connected to the vicinity of the tip of the motor arm 52, and protrudes from the front side surface of the motor arm 52, and is bent halfway to extend to the side of the reel arm 62. The pair of detecting arms 58 are connected to the front and rear side surfaces of the auxiliary arm 54. The pair of detecting arms are disposed to cross the reel arm 62 and the detected object 60.

Figure 6A:
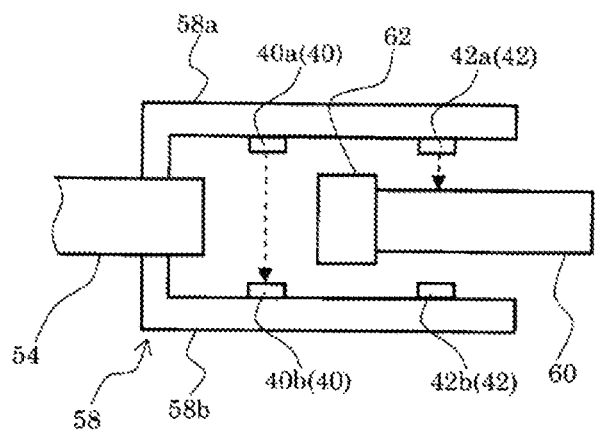
FIG. 6A is a view illustrating a position of a reel arm with respect to an auxiliary arm in a case where a tension of a film is proper.

FIG. 6A is a view illustrating, from the upper side, the auxiliary arm 54, the pair of detecting arms 58, the reel arm 62, and the detected object 60. As shown in FIG. 6A, the pair of detecting arms 58 include the first photoelectric sensor 40 having a light emitting part 40a and a light receiving part 40b and a second photoelectric sensor 42 having a light emitting part 42a and a light receiving part 42b. The light emitting parts 40a and 42a are respectively disposed on the inner surface of a detecting arm 58a, and the light receiving parts 40b and 42b are disposed respectively opposite to the light emitting parts 40a and 42a on the inner surface of a detecting arm 58b. The first photoelectric sensor 40 is disposed on the side of the auxiliary arm 54 (the motor arm side) of the pair of detecting arms 58, and the second photoelectric sensor 42 is disposed in a predetermined interval with respect to the first photoelectric sensor 40 on the side of the reel arm 62 in the pair of detecting arms 58.

Figure 6B:
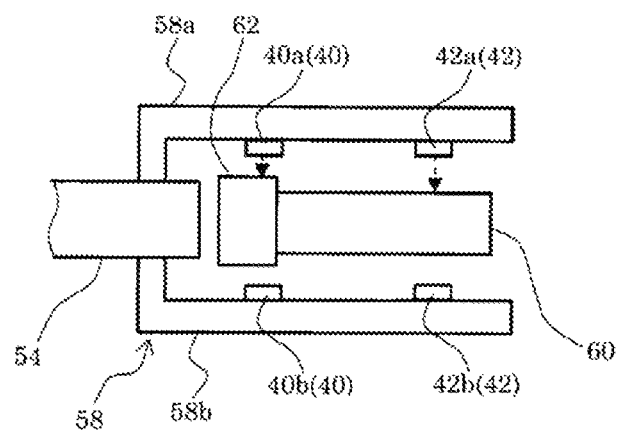
FIG. 6B is a view illustrating a position of the reel arm with respect to the auxiliary arm in a case where the tension of the film is excessively small.
Figure 6C:
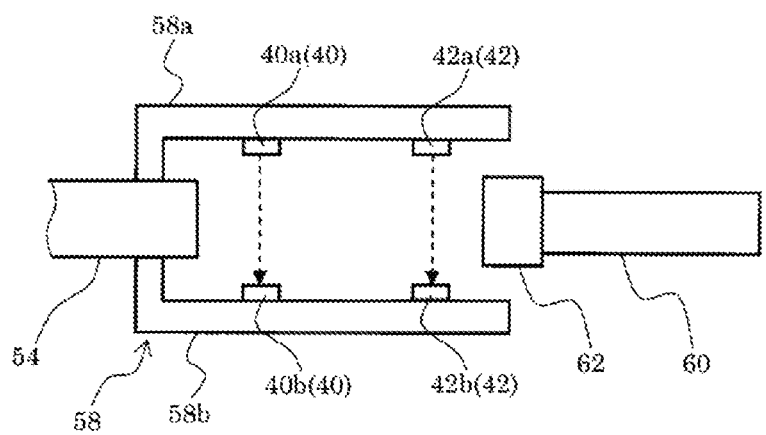
FIG. 6C is a view illustrating a position of the reel arm with respect to the auxiliary arm in a case where the tension of the film is excessively large.

The first photoelectric sensor 40 is capable of detecting the shielding of light (light shielded) from the light emitting part 40a to the light receiving part 40b, and the second photoelectric sensor 42 is capable of detecting the shielding of light (light shielded) from the light emitting part 42a to the light receiving part 42b. The first photoelectric sensor 40 and the second photoelectric sensor 42 detect the light shielded when the reel arm 62 or the detected object 60 enters between the pair of detecting arms 58 at the respective positions, and detect the presence thereof. As shown in FIGS. 6A to 6C, with the combination of whether there is light shielded with respect to the first photoelectric sensor 40 and the second photoelectric sensor 42, respectively, the position of the reel arm 62 (the detected object 60) with respect to the auxiliary arm 54 (motor arm) can be detected in three stages. That is, the interval a can be detected in three stages. The detecting signals (detecting result) of the first photoelectric sensor 40 and the second photoelectric sensor 42 are input to the determining part 39 (as shown in FIG. 4), and the determining part 39 determines whether the tension of the film 110 is excessively large, excessively small, or proper based on the combination of whether there is light shielded, which is the detecting result.

Since the first photoelectric sensor 40 and the second photoelectric sensor 42 are disposed on the detecting arms 58a and 54b (rotating bodies) rotated by rotating the motor arm 52 shown in FIG. 5, it is necessary to devise a wire for supplying power from the outside to the first photoelectric sensor 40 and the second photoelectric sensor 42 and transmitting the detecting signals from the first photoelectric sensor 40 and the second photoelectric sensor 42 to the outside. In the embodiment, the detecting arms 58a and 58b, the auxiliary arm 54, the motor arm 52, and the rotation shaft 50 of the winding motor 30 shown in FIG. 5 have a hollow structure. The wires of the first photoelectric sensor 40 and the second photoelectric sensor 42 are disposed inside the hollow structure and guided from the detecting arms 58a and 58b to the rotation shaft 50 of the winding motor 30. In addition, a member which is referred to as a slip ring 46 and capable of electrically connecting a wire in the rotation shaft and an outside wire 48 (fixed wire) is disposed on the rotation shaft 50. Accordingly, power can be supplied from the outside to the first photoelectric sensor 40 and the second photoelectric sensor 42 that rotate, and the detecting signals from the first photoelectric sensor 40 and the second photoelectric sensor 42 can be transmitted to the outside.

<Tension Adjustment>

In the following, the tension adjustment of the embodiment will be described. Step S104 in the flow of FIG. 3 is a step for tension adjustment. In Steps S100 and S102 described above, the film 110 is wound to dispose a new film 110 on the bottom surface of the mounting head 12, and in Step S104, the tension of the film 110 is adjusted.

First, in Step S200 of FIG. 3, the determining part 39 of the tension detecting part 38 determines whether there is light shielded (detection of the reel arm 62 or the detected object 60) with respect to the first photoelectric sensor 40 (first sensor). In the case where there is light shielded (Step S200: No), Step S208 is performed. The state is the state shown in FIG. 6B, and is a state in which the position of the reel arm 62 is close with respect to the auxiliary arm 54 (motor arm), that is, a state in which the extension spring 56 slightly extends or does not extend. In this case, in Step S208 of FIG. 3, the determining part 39 determines that the tension of the film 110 is excessively small. Then, in Step S212, the control part 20 rotates the winding motor 30 in the direction of winding the film 110 (forward direction), and rotates the winding reel 26 in the winding direction (the direction of the thick, black arrow of FIG. 5). Accordingly, the extension spring 56 is changed to a more extended state than before, and the tension of the film 110 is increased.

Meanwhile, in Step S200 of FIG. 3, in the case where there is no light shielded (Step S200: Yes), Step S202 is performed. In Step S202, the determining part 39 verifies whether there is light shielded (detection of the reel arm 62 or the detected object 60) with respect to the second photoelectric sensor 42 (second sensor). In the case where light is shielded (Step S202: No), Step S206 is performed. The state is the state shown in FIG. 6A, and is a state in which the position of the reel arm 62 is proper with respect to the auxiliary arm 54 (motor arm), that is, a state in which the extension of the extension spring 56 is in a desired state. In this case, in Step S206 of FIG. 3, the determining part 39 determines that the tension of the film 110 is proper, the process for tension adjustment ends, and Step S106 is performed.

Meanwhile, in Step S202, in the case where there is no light shielded (Step S202: Yes), Step S204 is performed. The state is the state shown in FIG. 6C, and is a state in which the position of the reel arm 62 is distant with respect to the auxiliary arm 54 (motor arm), that is, a state in which the extension spring 56 extends greatly. In this case, in Step S204 of FIG. 3, the determining part 39 determines that the tension of the film 110 is excessively large. Then, in Step S210, the control part 20 rotates the winding reel 20 in a reverse direction (the direction of the thick, broken, and black arrow in FIG. 5) by rotating the winding motor 30 in a reverse direction with respect to the direction of winding the film 110. Accordingly, the extension spring 56 is changed to a more contracted state than before, and the tension of the film 110 is decreased.

At the time of determining that the tension is excessively small or large (Step S208 or Step S204) and adjusting the tension (Step S212 or Step S210), the control part 20 returns to Step S200, verifies whether the tension is proper, and continues to adjust the tension until the tension is determined as proper (Step S206). Specifically, the control part 20 rotates the winding reel 26 via the winding motor 30 to adjust the tension until there is no light shielded (detection of the reel arm 62 or the detected object 60) with respect to the first photoelectric sensor and there is light shielded (detection of the reel arm 62 or the detected object 60) with respect to the second photoelectric sensor. Accordingly, feedback control is performed.

<Effects>

In the following, the effects of the mounting apparatus 10 of the embodiment are described. The mounting apparatus 10 of the embodiment detects the tension of the film 110 and adjusts the tension of the film 110 based on the detecting result. Accordingly, a desired tension on the film 110 disposed on the bottom surface of the mounting head 12 can be generated. Accordingly, the needle 88 for forming the hole for suction can smoothly pierce through the film 110 and the hole in a desired shape can be formed. In addition, the adhesion between the mounting head 12 and the semiconductor chip 100 at the time when the semiconductor chip 100 is suctioned to the bottom surface 12 via the film 110 can be reinforced. Accordingly, the adhesion can be prevented from being deteriorated, and the semiconductor chip 100 can be reliably prevented from falling from the mounting head 12.

In addition, since stepping motors are used in the dispensing motor 28 and the winding motor 30 in the embodiment, the rotation shafts of the dispensing motor 28 and the winding motor 30 can be rotated in a unit of a small rotating angle, and the winding amount of the film 110 can be fine-tuned. Specifically, since the rotation shaft of the winding motor 30 can be rotated in a unit of a small rotating angle at the time of adjusting the tension, the tension of the film 11 can be fine-tuned. In addition, by using a stepping motor, the winding motor 30 can be rotated reversely.

<Others>

While two photoelectric sensors are used as the tension detecting part 38 in the embodiment described above, any sensor may be used as long as the interval a of the motor arm 52 and the reel arm 62 shown in FIG. 5 can be directly or indirectly detected. In addition, the position of the sensor is not particularly limited. For example, by disposing a laser distance sensor in one of the motor arm 52 and the reel arm 62 and irradiating a laser toward the other, the interval a can be detected. In addition, the length of the extension spring 56 may also be detected, as the interval a, by a sensor.

In the case where the photoelectric sensor is disposed on the pair of detecting arms 58 as in the embodiment described above, the number of the photoelectric sensor may be one, and may also be three or more. If three or more photoelectric sensors are respectively disposed at a predetermined interval on the pair of detecting arms 58, the position of the reel arm 62 with respect to the motor arm 52 can be more precisely grasped, and the rotating amount of the winding motor 30 in the tension adjustment can be adjusted at higher precision.

In addition, while the pair of detecting arms 58 are connected with the motor arm 52 via the auxiliary arm 54 in the embodiment described above, the pair of detecting arms 58 may also be directly connected to the motor arm 52. In addition, in the embodiment described above, it is configured that the pair of detecting arms 58 are connected (indirectly) with the motor arm 52, and the detected object 60 is fixed to the reel arm 62. However, it may also be configured that the pair of detecting arms 58 are directly or indirectly connected with the reel arm 62, and the detected object 60 is fixed to the motor arm 52.

In addition, in the embodiment described above, while the pair of detecting arms 58 are configured to cross the reel arm 62 and the detected object 60, the pair of detecting arms 58 may also be configured to cross at least one of the reel arm 62 and the detected object 60. That is, if the reel arm 62 is formed to have a large width in the rotating direction, since the reel arm 62 can also serve as the detected object 60, the detected object 60 is not required, and the pair of detecting arms 58 may cross only the reel arm 62. Meanwhile, for example, if the detected object 60 is in a shape that protrudes from the front side surface (the right side of FIG. 5) of the reel arm 62 and is bent halfway to extend along the side of the motor arm 52 (same as the shape of the auxiliary arm 54 shown in FIG. 5), the pair of detecting arms 58 can be configured to cross only the detected object 60 but not the reel arm 62.

In addition, in the embodiment described above, after the winding of the film 110, the rollers 32, 34 on the dispensing side are locked, and the film 110 is fixed between the rollers 32, 34. Then, the tension detection and the tension adjustment for the film is performed under such state. However, it is not required to lock the rollers 32, 34. For example, in the case where a plurality of rollers are provided on the dispensing side, and the rollers are configured to dispense the film 110 in a meandering manner, even if the rollers are not locked at all, the film 110 can be fixed on the dispensing side.

In addition, in the embodiment described above, the extension spring 56 is disposed as an elastic member between the motor arm 52 and the reel arm 62. However, a gum, etc., may also be disposed as the elastic member.

In addition, as described above, if a suitable sensor, as the tension detecting part 38, capable of detecting the interval a between the motor arm 52 and the reel arm 62 is disposed, the tension can be detected as excessively small in the case where the interval a is less than the first predetermined value (predetermined value), and detected as excessively large in the case where the interval a exceeds the second predetermined value (predetermined value) greater than the first predetermined value. The first predetermined value and the second predetermined value may be changed in response to the amount of the film 110 wound on the winding reel 26. In the case where the amount of the film 110 wound on the winding reel 26 is large, since the diameter of the combination of the winding reel 26 and the film 110 is large, a large torque is generated in the reel arm 62 even if the tension of the film 110 is the same. Accordingly, it is possible that the tension is detected as proper even if the tension of the film 110 is actually excessively small, and the tension of the film 110 is detected as excessively large even if the tension of the film 110 is actually proper. Therefore, the more the amount of the film 110 that is wound, the larger values may be set as the first predetermined value and the second predetermined value.

Similarly, the rotating amount of the winding motor 30 at the time of tension adjustment may be changed in response to the amount of the film 110 wound on the winding reel 26. As the amount of the film 110 wound on the winding reel 26 increases, more film 110 is wounded through the rotation in the winding direction of the winding reel 26, and the tension of the film 110 increases. Similarly, as the amount of the film 110 wound on the winding reel 26 increases, more film 110 is dispensed from the winding reel 26 through the rotation of the winding reel 26 in the reverse direction, and the tension of the film 110 decreases. Therefore, as the amount of the film 110 that is wound increases, the rotation amount of the winding motor in the winding direction or the reverse direction at the time of tension adjustment may be decreased.

In addition, the mounting apparatus 10 of the embodiment described above is an apparatus (flip chip bonder) that performs flip chip bonding. However, the mounting apparatus 10 may also be an apparatus (die bonder), etc., which does not electrically connect the semiconductor die to the substrate, but fix the semiconductor die to the substrate by an adhesive material. In addition, the mounting apparatus 10 of the embodiment described above coats the adhesive material on the substrate 104 in advance (coating first method). However, instead of coating the adhesive material on the substrate 104 in advance, it may also be that an adhesive material such as NCF is attached to the back surface of the semiconductor chip 100, and the NCF, etc., is heated and cured to mount the semiconductor chip 100 on the substrate 104.

In addition, the mounting apparatus 10 of the embodiment described above mounts the semiconductor chip 100 to the substrate 104. However, it may also be that an electronic component (e.g., a transistor, a capacitor, etc.) other than the semiconductor chip 100 is mounted to a mounted member (e.g., a wafer, a glass, a resin, etc.) other than the substrate 104.

The film supply apparatus 90 of the embodiment described above can also serve for a purpose other than serving for the mounting apparatus 10. The technology for tension detection and tension adjustment described above is also applicable to any apparatus that winds a film, a string, a thread, etc., from a dispensing reel to a winding reel.

The present invention has been described above, but the present invention is not limited to such embodiments, and it is needless to say that the present invention can be implemented in various forms without departing from the scope of the present invention.

What is claimed is:

1. A mounting apparatus for mounting an electronic component comprising:
   a mounting head comprising a bottom surface configured to place a film between the electronic component and the bottom surface of the mounting head and mount the electronic component;
   a film winding mechanism comprising a winding reel and a dispensing reel, said film winding mechanism configured to rotate the winding reel to wind in a film spanning from the dispensing reel to the winding reel, and executing the winding of the film spanning so that the spanning film is configured to be disposed on the bottom surface of the mounting head each time when the electronic component is mounted;
   a tension detecting part configured to detect a tension of the film after the film is wound by the film winding mechanism; and
   a control part configured to rotate the winding reel by a winding motor to adjust the tension based on the tension detected by the tension detecting part,
   wherein the film winding mechanism comprises an elastic member disposed between a rotation shaft of the winding motor and the winding reel, and the elastic member comprises a spring, so that the winding reel follows rotation of the rotation shaft of the winding motor and causes the elastic member to deform; and
   the tension detecting part configured to detect the tension of the film based on the amount of deformation of the elastic member.

2. The mounting apparatus as claimed in claim 1, wherein the film winding mechanism further comprises:
   a motor arm, connected with the rotation shaft of the winding motor and extending in a predetermined direction; and
   a reel arm, connected with a rotation shaft of the winding reel, extending in a direction corresponding to the motor arm, and rotating with the motor arm about a same center,
   wherein one end of the elastic member is connected with the motor arm, other end of the elastic member is connected with the reel arm, and the elastic member causes the reel arm to extends in a direction corresponding to the motor arm, and
   wherein the tension detecting part configured to detect the tension based on an interval between the motor arm and the reel arm in a rotating direction, and the interval is generated by the deformation of the elastic member.

3. The mounting apparatus as claimed in claim 2, further comprises a pair of detecting arms connected with a first arm of one of the motor arm and the reel arm, which extend toward a second arm as other one of the motor arm and the reel arm, and said pair of detecting arms are configured to cross at least one of the second arm and a detected object connected with the second arm,
   the pair of detecting arms comprise a first sensor and a second sensor capable of detecting at least one of the second arm and the detected object between the pair of detecting arms,
   the first sensor is disposed on a side of the first arm in the pair of detecting arms and the second sensor is disposed in a predetermined interval in a direction distant from the first arm with respect to the first sensor in the pair of detecting anus, and
   the tension detecting part configured to detect the tension as excessively small in a case where the first sensor detects at least one of the second arm and the detected object, and detects the tension as excessively large in a case where the first sensor does not detect the second arm and the detected object and the second sensor does not detect the second arm and the detected object.

4. The mounting apparatus as claimed in claim 3, wherein the control part is configured to rotate the winding reel via the winding motor at a time when the tension is detected as excessively small or excessively large until the first sensor does not detect the second arm and the detected object and the second sensor detects at least one of the second arm the detected object.

5. The mounting apparatus as claimed in claim 1, wherein the control part is configured to rotate the winding reel via the winding motor in a winding direction at a time when the tension is detected as excessively small, and rotate the winding reel via the winding motor in a reverse direction with respect to the winding direction at a time when the tension is detected as excessively large.

6. The mounting apparatus as claimed in claim 1, further comprises a pair of detecting arms connected with a first arm of one of the motor arm and the reel arm, which extend toward a second arm as other one of the motor arm and the reel arm, and said pair of detecting arms are configured to cross at least one of the second arm and a detected object connected with the second arm, the pair of detecting arms comprise a first sensor and a second sensor capable of detecting the second arm or the detected object between the detecting arms, the first sensor is disposed on a side of the first arm in the pair of detecting arms and the second sensor is disposed in a predetermined interval in a direction distant from the first arm with respect to the first sensor in the pair of detecting arms, and the tension detecting part configured to detect the tension as excessively small in a case where the first sensor detects at least one of the second arm and the detected object, and detects the tension as excessively large in a case where the first sensor does not detect the second arm and the detected object and the second sensor does not detect the second arm and the detected object.

* * * * *